United States Patent [19]

Heller et al.

[11] 4,358,890

[45] Nov. 16, 1982

[54] PROCESS FOR MAKING A DUAL IMPLANTED DRAIN EXTENSION FOR BUCKET BRIGADE DEVICE TETRODE STRUCTURE

[75] Inventors: Lawrence G. Heller, Essex Junction; Harry J. Jones, Underhill; Harish N. Kotecha, Essex Junction, all of Vt.; Donald A. Soderman, Vienna, Va.

[73] Assignee: IBM Corporation, Armonk, N.Y.

[21] Appl. No.: 293,903

[22] Filed: Aug. 18, 1981

Related U.S. Application Data

[60] Division of Ser. No. 99,362, Dec. 3, 1979, abandoned, which is a continuation of Ser. No. 938,679, Aug. 31, 1978, abandoned.

[51] Int. Cl.$^3$ ............................................. H01L 21/26
[52] U.S. Cl. ................................... 29/571; 29/576 B; 148/187; 357/23
[58] Field of Search ............... 29/571, 576 B; 148/1.5, 148/187; 357/23 C, 24

[56] References Cited

U.S. PATENT DOCUMENTS

| | | | |
|---|---|---|---|
| 3,767,983 | 10/1973 | Berglund | 357/24 X |
| 3,789,267 | 1/1974 | Krambeck et al. | 357/24 |
| 4,087,832 | 5/1978 | Jambotkar | 148/1.5 X |
| 4,100,513 | 7/1978 | Weckler | 357/24 X |
| 4,142,199 | 2/1979 | Simi et al. | 357/24 |
| 4,771,229 | 10/1979 | Simi et al. | 357/24 X |

*Primary Examiner*—G. Ozaki
*Attorney, Agent, or Firm*—John E. Hoel

[57] ABSTRACT

The invention is the structure and process for making a bucket brigade device which comprises the merger of an MOS capacitor with an MOSFET device to form the charge transfer cell. A first thin N-type region is implanted at a first concentration in a portion of the P-type channel region of an FET device adjacent to the drain diffusion. A second region is implanted with N-type dopant at a second concentration less than the first concentration, adjacent to and continuous with the first implanted region. The N-type concentration in the second region is just sufficient to compensate for the P-type background doping in the channel region. This structure increases the charge transfer efficiency for the cell and reduces its sensitivity of the threshold voltage to the source-drain voltage. The gate for the device has a substantial overlap over the drain and a minimal overlap over the source and the gate to drain capacitance per unit area is maximized by maintaining a uniformly thin oxide layer across the gate region.

1 Claim, 20 Drawing Figures

PROCESS FOR MAKING A DUAL IMPLANTED DRAIN EXTENSION FOR BUCKET BRIGADE DEVICE TETRODE STRUCTURE

This is a division of application Ser. No. 99,362 filed Dec. 3, 1979, now abandoned, which is a continuation of application Ser. No. 938,679, filed Aug. 31, 1978, now abandoned.

FIELD OF THE INVENTION

The invention disclosed relates to semiconductor devices and fabrication processes and more particularly relates to an improvement in bucket brigade devices and processes for making same.

BACKGROUND OF THE INVENTION

A bucket brigade circuit is a sequence of switching transistors interconnecting capacitive storage nodes, with the gates of alternate transistors in the sequence being driven by non-overlapping clock pulses. Bucket brigade circuits may be embodied advantageously in field effect transistor technology providing a bucket brigade cell which is simple in structure and manufacture. A voltage (charge) signal representative of the unit of binary information is introduced at the source of a first one of the FET bucket brigade cells. When the clock pulse on the gate of the first bucket brigade cell appears it bootstraps the previously restored drain node, causing current to flow through the FET device, and the unit of binary information is transferred to the storage capacitance between the first cell and the second cell. Thereafter, when the clock pulse on the gate of the second bucket brigade cell appears, the unit of binary information stored at the capacitive node between the first cell and the second cell is then transferred through the second cell to the restored capacitive node between the second cell and the third cell. In this manner, a voltage (charge) signal may be transferred through a string of bucket brigade cells using a two-phase clock to accomplish a serial storage, signal transfer, or signal processing operation. This operation is shown schematically in FIG. 1d. For each transfer there is always one cell which was initially empty of propagated charge. This empty cell is restored to a reference potential at the last device in a string and is essentially propagated in the reverse direction of information flow. Thus, for a two-phase clock, one needs 2 N cells to store N bits of information. The number of cells can be reduced to $$\frac{(m)}{m-1} N$$

for a multi (m) phase clock storing N bits of information.

A successful bucket brigade cell design must possess a number of attributes. Since bucket brigade cells are not used in isolation but are used in chain-like configurations, employing large numbers thereof, the cell must be of small dimension and be amenable to fabrication in high density integrated circuit arrangements. Since long chains of these cells are required for many applications, the transfer efficiency of each cell must be very close to unity and that transfer efficiency must not be different between that for the transfer of a binary zero signal and that for the transfer of a binary one signal.

A typical prior art implementation of a bucket brigade cell is shown in FIG. 1a with a cross-section of the cell along line 1b shown in FIG. 1b and a cross-section of the cell along the line 1c shown in FIG. 1c. The bucket brigade cell shown in FIGS. 1a–1c is of the metal gate type, which, although not having a self-aligned gate, utilizes a more simplified fabrication process than polycrystalline silicon self-aligned gate devices do, resulting in a more planar surface contour on which finer resolution photolithography can be performed. The prior art bucket brigade cell is formed as part of an integrated circuit in a P-type semiconductor substrate 2 and has an n+ type diffusion 4 which serves as its capacitive storage node. Under the thick oxide layer 6 in FIG. 1b, is the diffusion 4' whose right hand side serves as the source in the bucket brigade device 12 and whose left hand side serves as a portion of the drain for the bucket brigade device to the left of device 12. Generally, the prior art bucket brigade cell shown in FIG. 1b has a thick layer 6 of silicon dioxide which serves to separate the gates 12 and 14 of adjacent bucket brigade cells. Formed between the thick layers 6 of silicon dioxide is a thinner layer of silicon dioxide which consists of a relatively thinner portion 8 having a thickness typically on the order of 500 Å to 1000 Å and a relatively thicker portion 10 having a thickness generally on the order of 1000 Å to 1500 Å. The gate metal 12 of the bucket brigade cell is deposited and photolithographically delineated between the thick layers 6 of silicon dioxide over the thin oxide layers 8 and 10. Differential oxide thickness beneath the gate electrode 12 of a nonself-aligned gate FET device, in the region 3 between regions 6 and 8 of FIG. 1b, is desirable as taught in the prior art, to reduce parasitic capacitive coupling between the gate 12 and source 4' diffusion. Indeed, such devices are desired to be present on the LSI chip, which may also contain a bucket brigade chain, in order to perform other logical and input/output operations. The prior art process for forming the thicker region 3 relies on the enhanced oxidation rate of heavily doped silicon, such as the diffusion 4'. However, with this benefit comes the detriment of the growth of a corresponding thicker oxide layer 10 over the diffusion 4, which also reduces the capacitance between the gate 12 and the diffusion 4. The detrimental effect of this occurs when the FET device is employed as an element in a bucket brigade chain, since the charge storage node of the cell formed between the gate and diffusion will have a reduced capacitance per unit area.

The capacitive storage portion of the bucket brigade cell generally is located at the portion of the thin oxide layer 10 and the field effect switching portion of the bucket brigade cell is generally localized at the portion 8 of the thin oxide layer. This prior art bucket brigade cell suffers defects which are typical of the prior art. The prior art has not recognized nor solved the problem of including on the same IC chip both differential oxide FET logic devices and bucket brigade devices having a minimized thickness of the silicon dioxide layer 10 in the capacitive storage region, to maximize the capacitance per unit area thereof while at the same time maximizing the thickness of the oxide in region 3, in FIG. 1b, to minimize capacitive coupling to the source. Charge propagation along a bucket brigade chain as shown in FIG. 1d, is the result of a capacitive bootstrapping operation, where the magnitude of charge propagated from node-to-node is a function of the difference in magnitude between the gate-to-source capacitance $C_{gs}$ and the gate-to-drain capacitance $C_{gd}$. The larger $C_{gd}$ is with respect to $C_{gs}$, the larger will be the magnitude of the charge transferred. Since the minimum capacitance per bucket brigade cell is required to achieve a detectable output signal for a particular application, the cell must be made larger in area to meet the capacitance requirement.

Still other problems with the prior art bucket brigade cell, as is typified by that shown in FIG. 1a–1c, revolve about the inability to provide for self-alignment of the structural elements of the bucket brigade cell so that the spacing "X", which is required for alignment tolerance between the diffusion 4 and the gate oxide etching levels force the designer to make the separation distance "Y" wider between the diffusions 4a and 9 of devices in adjacent chains of bucket brigade cells. Still another set of problems associated with the prior art bucket brigade device cells concerns channel shortening effects which occur when adjacent cells within the same bucket brigade chain are brought too closely together. Because of the substantial vertical depth of the diffusion 4 in FIG. 1b as it faces the channel region between the diffusion 4 and the diffusion 4′, as the separation distance between the diffusions 4 and 4′ is reduced, the threshold voltage of the field effect transistor portion of the bucket brigade device beneath the thin oxide layer 8 becomes sensitive to the magnitude of the voltage difference between the diffusions 4 and 4′. This causes the threshold voltage, and therefore the charge transfer efficiency of the device to be different for binary one signals than it would be for binary zero signals. Since the threshold voltage and charge transfer efficiency has become dependent upon the logical value of the signal transferred, long chains of such bucket brigade cells will introduce a degradation in the signal transferred especially apparent in the first different bit in a sequence.

OBJECTS OF THE INVENTION

It is therefore an object of the invention to increase the circuit density of a bucket brigade device circuit.

It is another object of the invention to reduce the sensitivity of the threshold voltage of a bucket brigade device to the source-to-drain voltage magnitude.

It is yet another object of the invention to minimize the overlap capacitance of the gate to the source and maximize the overlap capacitance of the gate to the drain in the bucket brigade device.

It is still another object of the invention to reduce the short channel effect problems in a bucket brigade device.

It is yet a further object of the invention to provide, on the same IC chip, FET logic devices having reduced parasitic capacitances and bucket brigade devices having a maximized gate-to-drain capacitance per unit area.

SUMMARY OF THE INVENTION

These and other objects, features and advantages are accomplished by the improved bucket brigade device and process disclosed herein. The invention is the structure and process for making a bucket brigade device which comprises the merger of an MOS capacitor with an MOSFET device to form the charge transfer cell. A first thin N-type region 107 is implanted at a first concentration in a portion of the P-type channel region of an FET device adjacent to the drain diffusion. A second region 113 is implanted with N-type dopant at a second concentration less than the first concentration, adjacent to and continuous with the first implanted region. The N-type concentration in the second region is just sufficient to compensate for the P-type background doping in the channel region. This structure increases the charge transfer efficiency for the cell and reduces its sensitivity of the threshold voltage to the source-drain voltage. The gate for the device has a substantial overlap over the drain and a minimal overlap over the source and the gate to drain capacitance per unit area is maximized by maintaining a uniformly thin oxide layer across the gate region.

DESCRIPTION OF THE FIGURES

These and other objects, features and advantages of the invention will be more readily appreciated with reference to the accompanying figures.

FIG. 1d is an electrical schematic diagram of the bucket brigade device chain of FIG. 1a.

FIGS. 3a–3f illustrate the sequence of process steps necessary to fabricate the invention shown in FIG. 2a.

FIG. 6 is a graphical representation of the relationship between transfer loss per stage versus the effective channel length for the dual implant bucket brigade device of FIG. 2a.

DISCUSSION OF THE PREFERRED EMBODIMENT

Figure 1A:
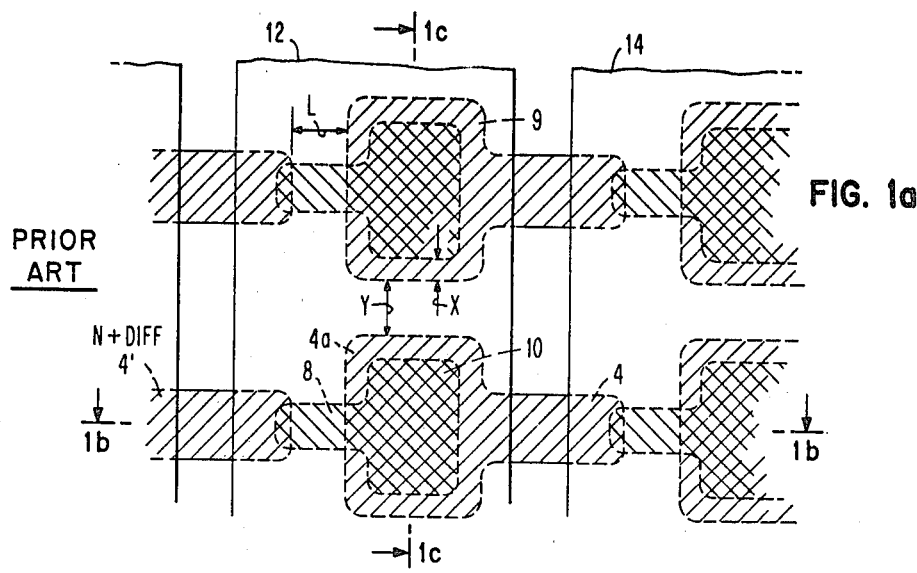
FIG. 1a is a plan view of a prior art bucket brigade device.
Figure 1B:
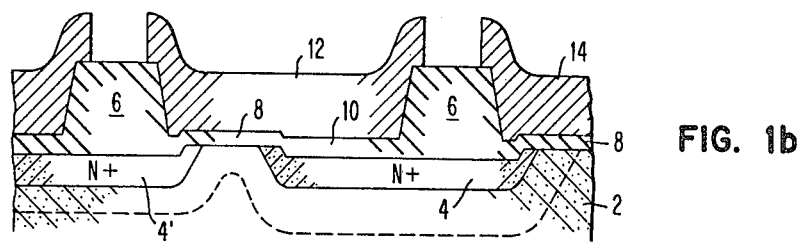
FIG. 1b is a cross-sectional view of FIG. 1a along line 1b.
Figure 1C:
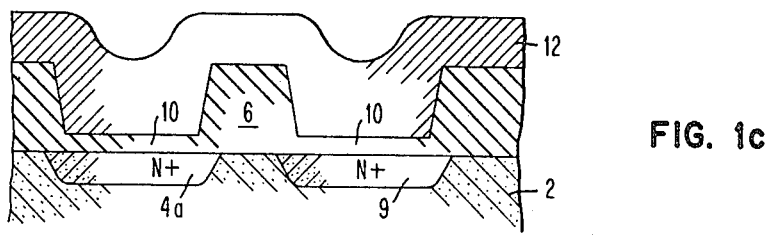
FIG. 1c is a cross-sectional view of FIG. 1a along line 1c.
Figure 1D:
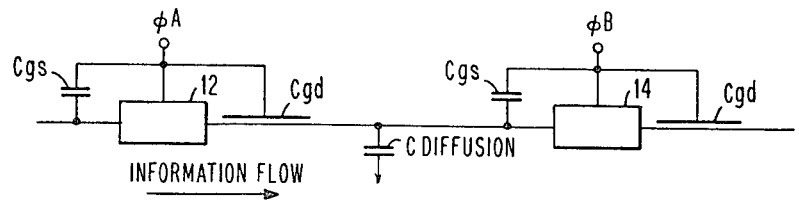
Figure 2A:
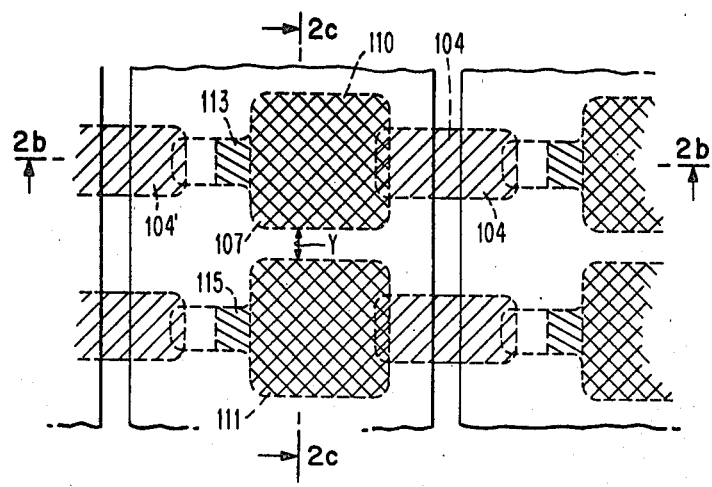
FIG. 2a is a plan view of the invention showing the improved dual implant bucket brigade device with a double implanted drain extension.
Figure 2B:
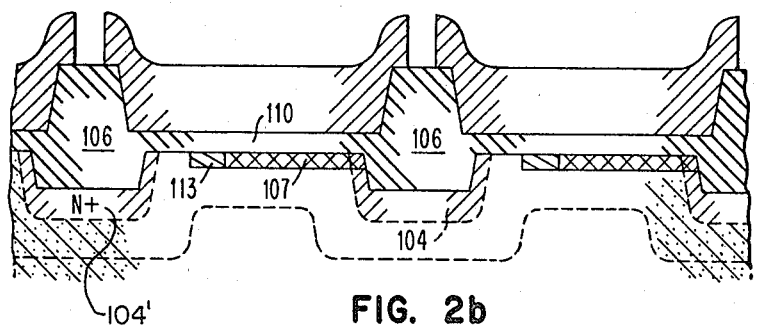
FIG. 2b is a cross-sectional view of FIG. 2a along line 2b.
Figure 2C:
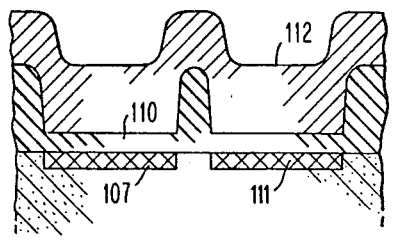
FIG. 2c is a cross-sectional view of FIG. 2a along line 2c.

The invention is the structure and process for making a bucket brigade device which comprises the merger of an MOS capacitor with an MOSFET device to form the charge transfer cell. A first thin N-type region 107 in FIGS. 2a–2c, is implanted at a first concentration in a portion of the P-type channel region of an FET device adjacent to the drain diffusion. A second region 113 is implanted with N-type dopant at a second concentration less than the first concentration, adjacent to and continuous with the first implanted region. The N-type concentration in the second region is just sufficient to compensate for the P-type background doping in the channel region. This structure increases the charge transfer efficiency for the cell and reduces its sensitivity of the threshold voltage to the source-drain voltage. The gate for the device has a substantial overlap over the drain and a minimal overlap over the source and the gate to drain capacitance per unit area is maximized by maintaining a uniformly thin oxide layer across the gate region. The cell structure for the dual implant bucket brigade device invention is shown in FIGS. 2a-2c in two serially connected sequences of such cells, a first sequence of cells with first region 107 and second region 113 and a second sequence of cells with first region 111 and second region 115.

The cells are formed, as shown in FIGS. 3a-3f, as elements of an integrated circuit in a P-type semiconductor substrate 102 having a doping between $7-10 \times 10^{15}/cm^3$. A source region 104 of opposite conductivity type (N-type) is formed by diffusion of phosphorus or arsenic in the surface of the substrate to a depth of 1-2 μm. A second similar drain region 104' for a second cell, is simultaneously formed spaced from the first source region 104. A thick silicon dioxide layer 106 is formed over the source regions 104 and 104' of thickness 8000 Angstroms. A thin oxide layer 110 having a uniform thickness of 500 Å to 700 Å is formed over the semiconductor substrate 102 in the region between the thick oxide layers 106 to form a serial chain of devices.

Figure 3A:
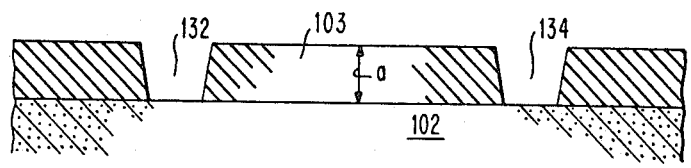
Figure 3B:
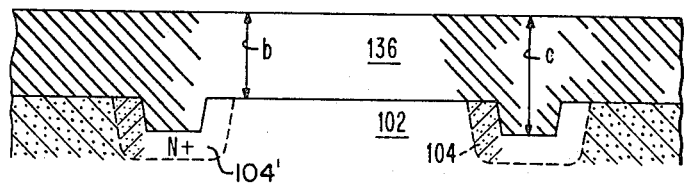
Figure 3C:
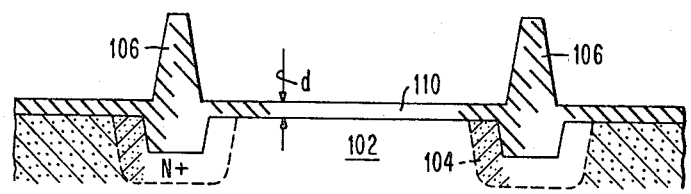
Figure 3D:
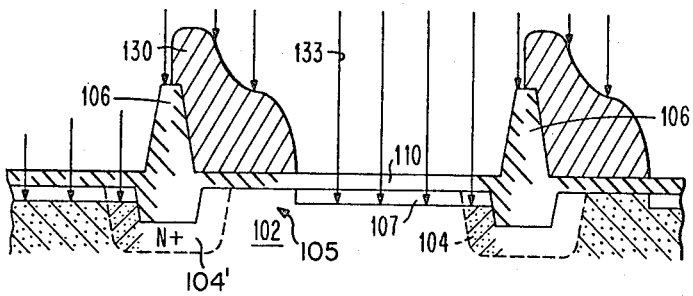

A portion of the thin oxide region 110 in each cell is subjected to the first ion-implantation of phosphorus or arsenic 133 in FIG. 3d which forms the drain electrode 107 of the FET device and the storage node of one plate of the thin oxide bootstrap capacitor. An implanted ion dose of $1-5 \times 10^{13}/cm^2$ is sufficient to form the N-type layer 107 at less than 0.2 μm depth from the surface. This implanted region forms the drain 107 of the FET device, while the remaining portion of the substrate beneath the thin oxide region, between the implant 107 and the source diffusion 104' forms the FET device channel 105.

Figure 3E:
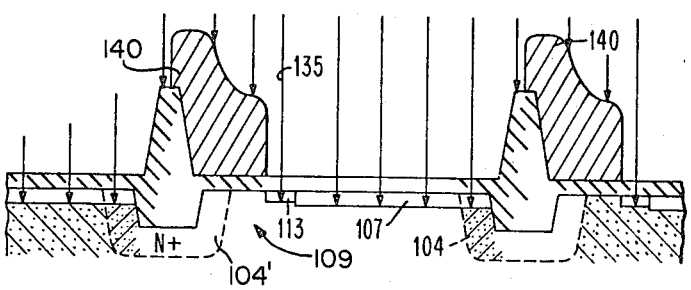

A second ion-implant 135 of FIG. 3e overlaps the first implanted region 107 and extends further into the thin oxide FET device channel region 105, forming the low threshold region 113. The second implantation 135 has a lower implant dose of $0.5-1 \times 10^{12}/cm^2$ of phosphorus or arsenic to compensate the substrate doping. The resulting device structure of FIG. 3f consists of two merged FET devices with different threshold voltages. The unimplanted region 109 of the channel 105 nearest the source 104' has a threshold voltage around 1 volt while the implanted region 113 near the implanted drain 107 has a lower threshold voltage between 0 and −1 volts.

Figure 3F:
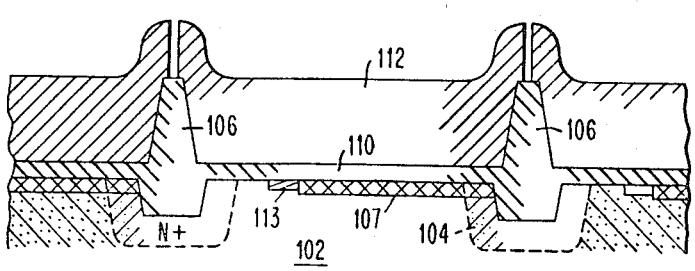

A gate conductor 112 lies over the thin insulating layer 110 to complete the bucket brigade device structure of FIG. 3f.

Ions in the second ion-implant 135 can be used elsewhere in peripheral circuitry on the integrated circuit chip for well-known depletion load FET devices, for example.

The dual implant bucket brigade device cell formed with a merged charge storage capacitor and FET structure has several advantages: (1) The cell has a threshold voltage whose sensitivity to the source-to-drain potential is reduced yielding a high charge transfer efficiency. (2) The cell is very dense due to the superposition of the drain and thin oxide region which serves as the capacitor. And (3) The cell provides a large signal charge resulting from the maximum bootstrap capacitance due to the thin insulating layer in the implanted drain region and minimum parasitic capacitance due to thicker layers over the diffused regions. The process for making the dual implant bucket brigade device of FIGS. 2a-2c is shown in the FIGS. 3a-3f.

The process begins in the same manner as for the single implant device described in U.S. Pat. No. 4,142,199 by V. M. Simi, et al. entitled "Bucket Brigade Device and Process." The process commences in FIG. 3a by starting with a P-type silicon substrate 102 of approximately 1.5 ohm-centimeters (a doping concentration of $7-10 \times 10^{15}/cm^3$) and growing an initial oxide layer 103 of 3000 Å thickness, denoted as "a" in FIG. 3a, by a conventional thermal oxidation process. Windows 132 and 134 are then etched in the oxide layer 103. The source diffusions 104 and 104' are then formed in FIG. 3b by depositing phosphosilicate glass (PSG) over the thermal oxide layer 103 and the exposed windows 132 and 134 at a temperature of 870° C. for approximately twenty-five minutes. A source drive-in cycle of approximately 250 minutes in steam at 900° C. results in a 9500 Å thickness of phosphosilicate glass over the source regions 104 and 104', denoted as "c", and a 7500 Å thickness of silicon dioxide 136 over the remaining areas, denoted by "b", which results in a nearly planar surface for the resultant layer 136 of the phosphosilicate glass and silicon dioxide as shown in FIG. 3b.

Thereafter, a photo-oxide etching step is employed to form windows in the thick oxide structures between adjacent diffused regions, as shown in FIG. 3c. There is some intentionally introduced overlap of these windows over the diffusions to insure continuity between a diffusion and the thin oxide FET device channel to account for photoresist mask-to-mask alignments and tolerances. This overlap on the source diffusion defines the parasitic capacitance $C_{gs}$. The next step is an additional oxide growth step comprising 900° C.-250 minutes dry oxidation, 850° C.-10 minutes phosphosilicate glass deposition, and 1000° C.-20 minutes anneal to form the thin oxide layer 110, of thickness, 500 Å, denoted as "d" in FIG. 3c.

The next step involves depositing a layer of photoresist 130 over a portion of the thin oxide layer 110 and the portion of an adjacent thick oxide structure 106 as shown in FIG. 3d, to serve as an ion-implantation mask for the implantation of phosphorus ions at 65 Kev. For a thin oxide layer 110 having a thickness of 500 Angstroms, a 65 Kev phosphorus ion beam exposure with $10^{13}/cm^2$ dose level will yield the N-type drain extension 107. This drain extension serves as the capacitive storage node for the device. For a 25fF bootstrap capacitor which is to store a typical 100fC signal charge, it occupies an area of $5 \times 6$ μm.

After the first ion-implantation mask 130 is removed, a second photoresist ion-implantation mask 140 is formed which exposes a larger area of thin oxide as shown in FIG. 3e. This second implant overlaps the drain extension 107 and exposes an additional 2-4 μm of the remaining thin oxide channel 105 between the diffusion 104' and drain 107.

FIG. 3e shows the second ion-implant of phosphorusions 135, forming the low threshold portion 113 of the FET device channel 105.

The second implant 135 as a dose level is substantially lower than the dose level of the first implant 133 such that the surface 113 forms a selectively invertible drain extension.

After removing the second mask 140 and forming a gate electrode 112 in the window, the improved bucket brigade device isformed having a dual implant as shown in FIG. 3f.

The final steps of the photo-oxide etching for contacts and depositing the metal gates 112 of aluminum-copper and etching the metal structures, completes the process.

Figure 4:
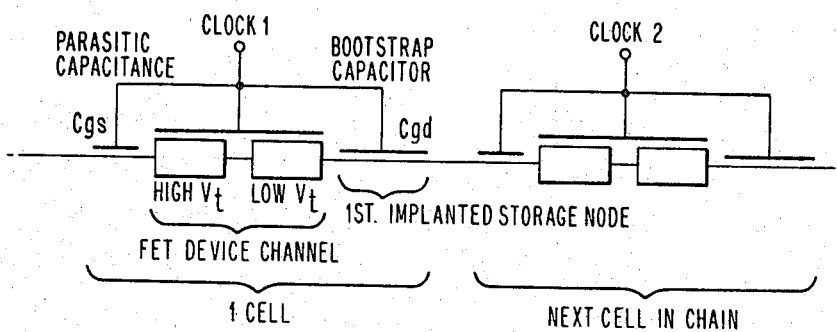
FIG. 4 illustrates high and low threshold voltage portions of FET device channel and bootstrap capacitor formed over ion-implanted storage node and electrical schematic of two cells in a bucket brigade device serial chain.
Figure 5A:
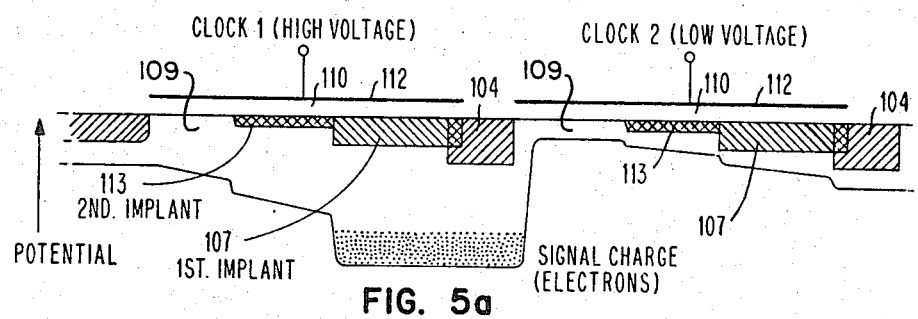
FIGS. 5a–5c illustrates, using potential well diagrams, the improvement in charge transfer efficiency due to dual implant structure.
Figure 5B:
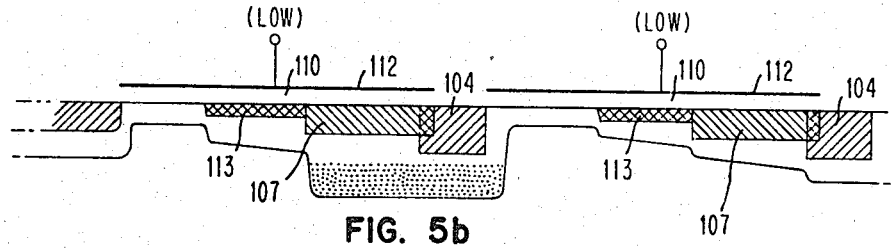
Figure 5C:
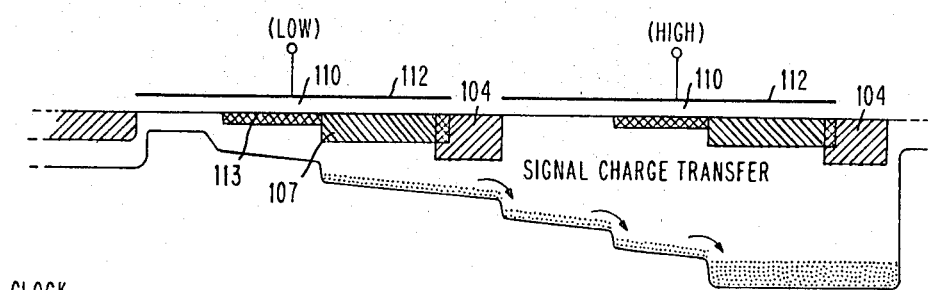
Figure 5D:
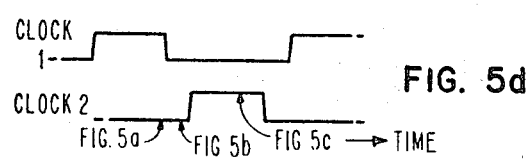
FIG. 5d illustrates clock voltage waveform in charge transfer sequence of FIGS. 5a–5c.

This dual ion-implant device structure and process configuration permits substantial improvement in bucket brigade device shift register operation. The single implanted structure of copending U.S. Pat. No. 4,142,199 by V. M. Simi et al. assigned to the instant assignee, exhibits a density improvement due to the N-type drain extension aligned to the thin oxide bootstrap capacitor. The transfer efficiency of the single implanted device was also improved by the shallow depth of the drain extension which results in less short channel threshold voltage modulation with drain voltage. However, the new dual ion-implant structure disclosed herein provides the still further significant advantage of a substantially better transfer efficiency due to even less threshold voltage variation of the combined high threshold voltage portion 109 and low threshold voltage portion 113 of the FET device channel 105. This can be represented as two serial FET devices as shown in FIG. 4. At high drain voltages the low threshold portion 113 of the channel 105 is depleted and the majority of the source-drain voltage is dropped across this portion as in standard pinch off operation (saturated mode). The threshold voltage for the combined devices is then governed by the high threshold portion 109 of the channel 105. Thus, any change in source-drain voltage does not appreciably effect the total device channel length and threshold as in uniform channel devices which suffer the well-known voltage induced channel shortening and short channel effect.

FIG. 5 shows another approach to illustrate the improvement in transfer efficiency with a dual implant bucket brigade device. The potential cell diagrams of two cells at various times in the transfer sequence are shown in FIGS. 5a–5c for non-overlapping two clock phases (FIG. 5d). Initially, (FIG. 5a) with clock 1 at a high voltage the signal charge (electrons) are concentrated in the high potential implanted drain extension 107 and N-type diffused region 104. During the transfer process the clock 1 voltage is reduced (FIG. 5b), lowering the potential of the signal charge. The high threshold portion 109 of the FET channel 105 acts as a barrier preventing charge from spilling into the previous cell. When clock 2 is at a high voltage (FIG. 5c) a deep potential well is formed in the drain extension of this second bucket brigade device cell and the high threshold portion of the channel is reduced allowing the signal charge to propagate into this next cell. It is desirable for high transfer efficiency, to keep this barrier region as narrow as possible to allow all the signal charge to diffuse and drift into the next cell independent of the source-drain potential. However, the well-known channel length modulation and short channel effects on threshold voltage can cause incomplete charge transfer on standard uniform channel devices. The dual implant structure essentially reduces this dependency, and as shown in FIG. 5c it allows the signal charge to transfer in several smaller steps with a more constant gradient which decreases the possibility of some residual charge becoming stuck in a corner of the previous cell.

Figure 6:
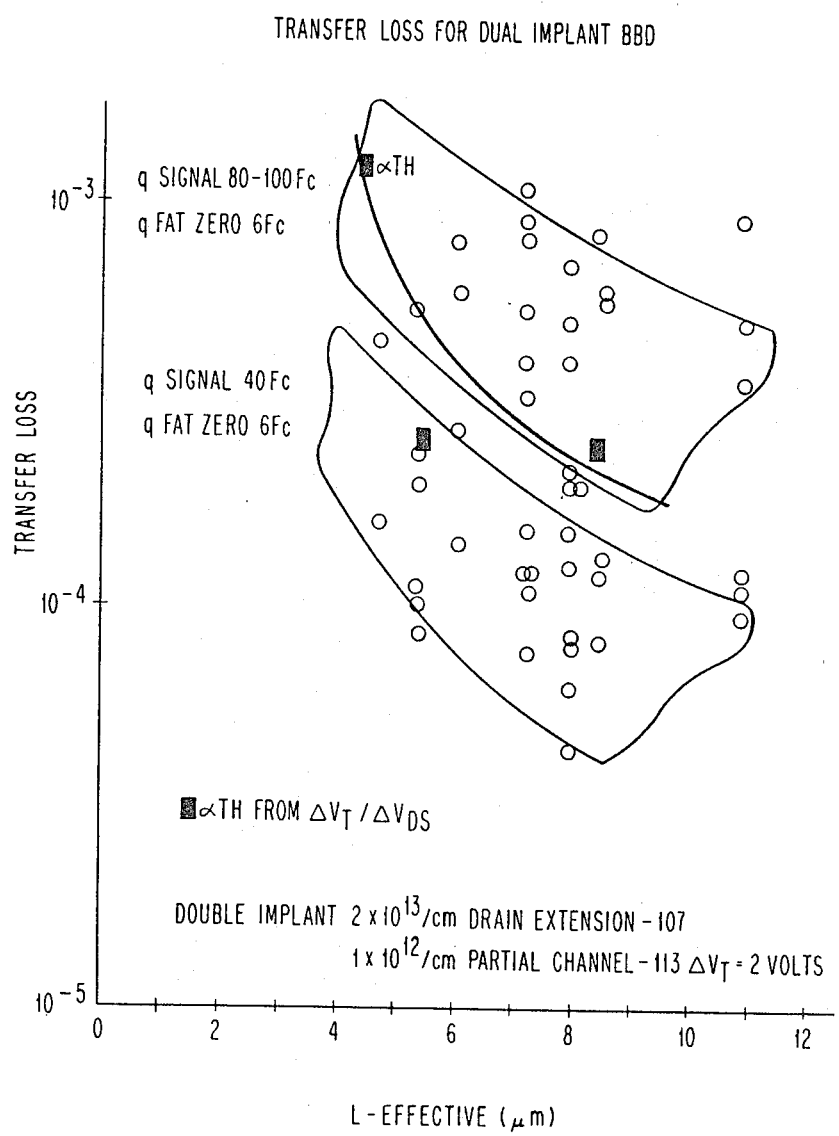

FIG. 6 is a graphical representation of the relationship between the low frequency (100 KHz) transfer loss per stage versus the effective channel length for the dual implant bucket brigade device. This transfer loss is in reasonable agreement with the ($\alpha$th) loss calculated from the measured variation in threshold voltage with drain-source voltage when operated in saturated mode. The gradient in potential across the dual FET structure also improves the transfer efficiency at high frequencies. With the shorter high threshold voltage portion of the channel required for good low frequency transfer efficiency, the conductance through the FET channel is increased which increases the rate of charge transfer for good efficiency at higher operating frequencies.

While the invention has been particularly shown and described with reference to the preferred embodiment thereof, it will be understood by those skilled in the art that the foregoing and other changes in form and detail may be made therein without departing from the spirit and scope of the invention.

Having thus described our invention, what we claim as new, and desire to secure by Letters Patent is:

1. A process for making a serially connected plurality of bucket brigade devices in a silicon semiconductor substrate of P-type conductivity and a dopant concentration of from 7 to $10 \times 10^{15}/cm^3$, each of said devices occupying a device area bounded on opposed ends by a first and a second diffusion of N-type conductivity, the first diffusion of a first device serving as the second diffusion of a next serially connected device, with a thick insulating layer overlying said semiconductor substrate having a plurality of windows therethrough, each said window juxtaposed over and exposing a corresponding one of said device areas, comprising the steps of:

growing a thin insulating layer of silicon dioxide on the surface of said substrate in each of said device areas, to a thickness of from 500 Å to 700 Å;

depositing a first ion implantation blocking mask over a first portion of each of said device areas, masking a channel region adjacent to said first diffusion and exposing a capacitor plate region adjacent to said second diffusion, said first mask having an edge defining the boundary between said channel region and said capacitor plate region;

ion implanting N-type conductivity dopant ions at an energy of 65 Kev and a first dose of from 1 to $5 \times 10^{13}/cm^2$ through said thin insulating layer and into said substrate in said capacitor plate region of each of said device areas, forming an N-type conductivity capacitor plate in said substrate which has a terminal edge at said boundary between said channel region and said plate region and which electrically contacts said second diffusion;

removing said first ion implantation blocking mask and depositing a second ion implantation blocking mask over a second portion of each of said device areas, masking a first, high threshold voltage portion of said channel region adjacent to said first diffusion and exposing a second, low threshold voltage portion of said channel region adjacent to said terminal edge of said capacitor plate;

ion implanting said N-type conductivity ions at a second dose of from 0.5 to $1 \times 10^{12}/cm^2$, which is lower than said first dose, through said thin insulating layer and into said substrate in said low threshold voltage portion of said channel region, forming an N-type conductivity doped low threshold voltage region having a threshold voltage of between 0 and $-1$ volts;

said high threshold voltage portion of said channel region having a threshold voltage of approximately $+1$ volts;

removing said second mask and depositing a gate electrode on said thin insulator layer over said channel region and said capacitor plate region in each of said device areas;

whereby an improved, serially connected plurality of bucket brigade devices is formed.

* * * * *